United States Patent [19]
Kitajo

[11] Patent Number: 5,838,066
[45] Date of Patent: Nov. 17, 1998

[54] MINIATURIZED COOLING FAN TYPE HEATSINK FOR A SEMICONDUCTIOR DEVICE

[75] Inventor: Sakae Kitajo, Tokyo, Japan

[73] Assignee: NEC Corporation, Tokyo, Japan

[21] Appl. No.: 766,990

[22] Filed: Dec. 16, 1996

[30] Foreign Application Priority Data

Dec. 18, 1995 [JP] Japan ..................... 7-328815

[51] Int. Cl.⁶ ............................. H05K 7/20; H01L 23/46
[52] U.S. Cl. ................... 257/722; 257/713; 257/721; 257/714; 257/712; 361/695; 361/687; 361/697
[58] Field of Search .................... 257/722, 721, 257/712, 714, 766, 713, 666; 361/695, 704, 687, 697; 165/80.3, 185, 122

[56] References Cited

U.S. PATENT DOCUMENTS

| | | | |
|---|---|---|---|
| 5,504,650 | 4/1996 | Katsui et al. | 257/722 |
| 5,535,094 | 7/1996 | Nelson et al. | 257/722 |
| 5,583,316 | 12/1996 | Kitahara et al. | 361/709 |
| 5,629,560 | 5/1997 | Katsui et al. | 257/722 |
| 5,630,469 | 5/1997 | Butterbaugh et al. | 257/722 |
| 5,689,404 | 11/1997 | Katsui | 361/697 |

FOREIGN PATENT DOCUMENTS

| | | |
|---|---|---|
| 64-13751 | 1/1989 | Japan . |
| 2-58900 | 2/1990 | Japan . |
| 6-275750 | 9/1994 | Japan . |
| 7-254670 | 10/1995 | Japan . |

*Primary Examiner*—Tom Thomas
*Assistant Examiner*—Alexander Oscar Williams
*Attorney, Agent, or Firm*—Sughrue, Mion, Zinn, Macpeak & Seas, PLLC

[57] ABSTRACT

To provide a semiconductor device heatsink that is mounted to a semiconductor device and that improves the cooling efficiency, a semiconductor device heatsink has a configuration in that the heatsink has a group of fins 1 and an air-blowing fan, the fins being formed by a large number of plates or pins on top of a base and the air-blowing fan comprising a fan rotating mechanism and a centrifugal fan 2, covers 3 and 4 being provided on the group of fins and the centrifugal fan and further an air intake aperture being provided on the centrifugal fan cover, in the direction of rotation. A centrifugal fan, rather than an axial fan as used in the past, is used, covers are provided on the heatsink and on the fan, so that air does not leak to the outside, and an air intake aperture is provided on the side of the fan cover. By doing this, heat radiating performance is improved, while making it possible to achieve a compact heatsink, which contributes to the compactness of the electronic equipment in which it is used.

9 Claims, 2 Drawing Sheets

MINIATURIZED COOLING FAN TYPE HEATSINK FOR A SEMICONDUCTIOR DEVICE

BACKGROUND OF THE INVENTION

1. Field of the Invention

The present invention relates heatsink for a semiconductor device onto which is mounted a chip such an integrated circuit chip or an LSI chip.

2. Description of the Related Art

Recent sophisticated semiconductor devices are not only undergoing progressive reductions speed per gate, i.e., switching speed of a semiconductor device and the power-time product per gate, but also, with developments in fine machining technology, are undergoing a reduction in the surface area occupied by each gate.

For this reason, there is a trend for semiconductor chips to become faster and have a higher degree of integration. On the other hand, the packaging technology which protect these semiconductor chips so as to improve reliability of packages has been developed into an technical field in which a high level of mounting technology is needed, by introducing semiconductor chip bonding technology.

Accompanying this, there has been in recent years a progressive adopting various semiconductor packages for housing of large-scale integrated circuits or high-density, compact LSI chips for the purpose of improving, for example, the processing performance and reliability of computers and the like.

When the level of integration of this kind of device becomes high, heat dissipation in the semiconductor chip increases. For this reason, although LSI chips which have a large power consumption are mounted on packages of ceramic, which has a larger thermal conductivity than plastic, there is of course a limit to the cooling of the LSI chip by a board alone.

Because of the above-noted situation, in previous semiconductor packages which mounted LSI chips that were both high speed and compact, from the standpoint of radiation of heat from the LSI chip, a heatsink made of aluminum or copper, which has a high heat radiating efficiency was affixed to the top surface of the semiconductor package using solder or an adhesive that has good thermal conductivity so as to cause radiation of heat. Recently, there have also been cases in which a cooling fan is mounted directly to the top surface of the heatsink so as to improve the heat radiating performance.

FIG. 4 is a perspective view of an example of a heatsink for a semiconductor device in the past. In this drawing, the reference numeral 11 denotes fins, on top of which mounted an axial fan 12, for the purpose of feeding air. The fins 11 are made of a material having good thermal conductivity, such as aluminum or copper. The axis fan 12 is mounted so as to blow air downward, causing air to strike the fins.

At present, such semiconductor device heatsinks are being manufactured, and are used for cooling of high-power semiconductor packages within computers and switching equipment.

As another example of a heatsink of the past, there is, as disclosed in the Japanese Unexamined Patent Publications (KOKAI) Nos. 2-58900 and 64-13751, a heatsink which makes use of not an axial fan, but sirocco fan or centrifugal fan as a cooling fan.

However, with heatsinks having the various constructions as described above, there is a shortcoming, in that the heat radiating efficiency of the heatsink is not that good, resulting in insufficient cooling effect. Because of this, the chip within the semiconductor device itself experiences a temperature rise, causing further problems such as a decrease of operating speed of the device.

Additionally, because the intake of air to the axial fan is from the top, to achieve good performance, it is necessary to provide a space of several centimeters above the heatsink, this being unsuitable for high-density mounted packaging, and leading to an increase in size of the equipment.

On the other hand, the Japanese Unexamined Patent Publications (KOKAI) Nos. 6-275750 and 7-254670 also show a heatsink constructions which can be used for semiconductor devices.

However, the former one discloses a heatsink in that an air intake aperture is provided at an upper portion over a fan and arranged in a direction of a rotational axis of the fan. Therefore in this heatsink, a sufficient amount of space should be prepared in the vicinity of the air intake aperture.

Accordingly, when this heatsink is assembled with a semiconductor device, a highly integrated semiconductor device cannot be obtained.

While, the latter discloses a heatsink in that blades of a fan are moved within spaces formed between adjacently arranged fins.

Therefore, in this heatsink, when it is assembled, high level of accuracy is required causing production cost for semiconductor devices to be increased.

SUMMARY OF THE INVENTION

An object of the present invention is to provide a heatsink which suppresses a temperature rise of a chip and efficiently serves for radiation so as to improve the reliability with respect to the heatsink when operating even when it is mounted on a semiconductor device on which a high-level integration LSI chip which generates a large amount of heat is mounted, and which also has a small occupied volume when built into a piece of equipment.

To achieve the above-noted object, a heatsink for a semiconductor device according to the present invention is a semiconductor device heatsink comprising a group of fins and an air-blowing fan, said group of fins being formed by a large number of pins or plates on top of a flat board, said group of fins being provided with a cover on a top surfaces thereof, so as to form an air intake portion on one ends of this group of fins and an air exhaust aperture on another end of said group of fins, said air-blowing fan comprising a fan rotating mechanism and a centrifugal fan, said centrifugal fan being provided with a cover on which an air intake aperture being provided, said air intake aperture being provided in the direction of rotation of said said centrifugal fan.

In a heatsink for a semiconductor device according to the present invention, in order that a sufficient amount of air passes through the air flowing paths, even if the spacing between the fins is small, instead of an axial fan such as in the past, a centrifugal fan is used, and additionally the heatsink and the fan are provided with a cover so that air does not leak to the outside. By doing this, it is possible to achieve high heatsink performance. In addition, because the air intake aperture to the fan is provided in the direction of rotation of the fan, air intake aperture for air is on the side of the heatsink, enabling a compact design when building this into equipment.

DETAILED DESCRIPTION OF THE PREFERRED EMBODIMENTS

Figure 1A:
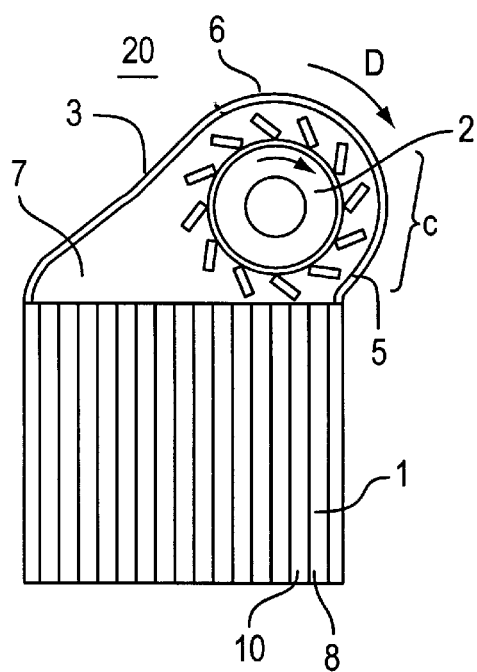
FIG. 1(A) and 1(B) are cross-sectional views of embodiments of the heatsink of the present invention.

Next, the forms of an embodiment of the present invention will be described, with reference being made to the appropriate accompanying drawings.

FIGS. 1(A) and 1(B) and FIGS. 2(A) and 2(B), respectively, show a cross-sectional view and a perspective view of different embodiments of the present invention from each other.

The one embodiment of the present invention as disclosed in FIG. 1(A) and FIG. 2(A) will be explained, first, hereunder.

In these drawings, the reference numeral 1 denotes fins, formed from a plurality of plates 8 which are line up vertically on a top of a flat plate 9, their material being aluminum, 2 is a centrifugal fan, which is rotated in a direction as indicated by an arrow D, for example, by a motor therewithin, enabling the feed of air in the direction of the group of fins. The numeral 3 denotes a fan cover which is provided around the periphery of the centrifugal fan 2, this being of a construction so as to prevent the leakage of air to the outside.

There is a fin cover 4 around the periphery of the fins 1, this also being of a construction that does not allow air to leak to the outside. On the side of the centrifugal fan and along the direction D of rotation thereof is provided an air intake aperture 5, its construction being such that air is taken into the hermetical chamber by the centrifugal fan 2 from this part and is fed in the direction in which the fins are arranged.

Because of this construction of the heatsink 20 of the present invention, by causing the centrifugal fan 2 to rotate, even if the spacing between the fins 1 is extremely small, the pressure drop in the air between the fins is made small, so that it is possible to cause air to flow without reducing the amount of air, the result being a great improvement in heat radiating efficiency. In addition, because the air intake aperture 5 is on the side, there is no need to provide a space above the heatsink 20 for the purpose of taking in air, the result being that it is possible to achieve high density within the equipment.

As a previous example, in the cooling device of an electronic equipment unit which is noted in the above-described Japanese Unexamined Patent Publication (KOKAI) No. 2-58900, an air-blowing sirocco fan is used for air cooling used in electronic devices.

When using a sirocco fan, however, for cooling a space is required to the degree of the rotating diameter of the fan, it being necessary to mount a large-diameter fan to achieve a large flow, the result being that the size of the overall electronic equipment becomes large.

In addition, in the case of the power semiconductor circuit unit noted in the Japanese Unexamined Patent Publication (KOKAI) No. 64-13751, while a centrifugal fan is used for air cooling as is the case in the present invention, it differs from the heatsink of the present invention in terms of the position of the air intake aperture for the purpose of taking air into the fan.

In the embodiments in this citing, an air intake aperture is provided on the top surface, whereas in the present invention the air intake aperture is provided on the side. Therefore, with a heatsink 20 according to the present invention, it is not necessary to have a space at the top surface of the semiconductor device for the purpose of air intake, the result being that it is possible to achieve a more compact piece of electronic equipment having plurality of semiconductor devices than that in the past.

A comparison was made between the thermal resistance of a semiconductor device to which was mounted a semiconductor heatsink having a construction so that air is fed to the group of fins by means of a centrifugal fan and that of a semiconductor to which was mounted a semiconductor heatsink having a construction as in the past. With the semiconductor device to which was mounted a heatsink according to the present invention, the thermal resistance when the motor was driven so as to rotate by the rated voltage was $1.6_0$C/W. In contrast to this, with the semiconductor device to which was mounted an axial fan type heatsink such as in the past, the thermal resistance was $2.0_0$C/W. From this, it was seen that heatsink having a construction in which the centrifugal fan of the present invention was used had a larger heat radiating efficiency than the axial fan type of heatsink of the past.

In the above-noted embodiment, although aluminum was used as the heatsink material, there is no limitation to this material, it being obvious that it is possible to use any material that has a good thermal conductivity to achieve the effect of the present invention. Furthermore, while the a motor was used to cause the centrifugal fan to rotate, there is no limitation to the use of a motor, it being possible to have an arbitrary mechanism that causes the fan to rotate.

Another embodiment of the present invention as disclosed in FIG. 1(B) and FIG. 2(B) will be explained, hereunder.

The heatsink 20 of the sencond embodiment of the present invention has the similar construction as that of the above-mentioned first embodiment except for the fin 1.

In this embodiment, the group of fins 1 are consisted of a plurality of pins 8' provided on a surface of the flat plate 9 and forming a plurality of air flowing paths 10 among these pins 8'.

Accordingly, the functions thereof and the effects which can be obtained by this embodiment will be identical to those of the above-mentioned embodiment.

From these embodiments of the present invention, it can be acknowledged that the construction of the heatsink 20 of the present invention has more specific configuration in which a semiconductor device heatsink 20 comprising a group of fins 1 and an air-blowing fan 2, wherein said heatsink 20 is further provided with a plurality of air flowing paths 10, each formed by the group of fins 1 consisting a plurality of pins 8' or plates 8 formed on top of a flat plate 9 and a cover plate 4, and with a hermetical chamber 7 being arranged at adjacent to one ends portion of the air flowing paths 10 and being extended in a direction along which a longitudinal axis of the air flowing path 10 is extended, and wherein a centrifugal fan 2 having a rotational axis of which being perpendicular to the longitudinal axis of the air flowing path 10, being provided inside of the hermetical chamber 7, and further wherein an air intake aperture 5 being provided on a side wall portion 6 of the chamber 7 and which is arranged in a direction perpendicular to the longitudinal axis of the air flowing path 10.

Figure 2A:
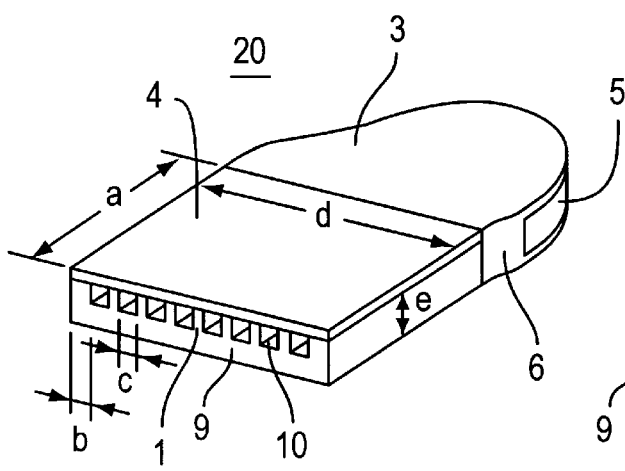
FIGS. 2(A) and 2(B) are perspective views of embodiments of the present invention that are shown in FIGS. 1(A) and 1(B), respectively.
Figure 2B:
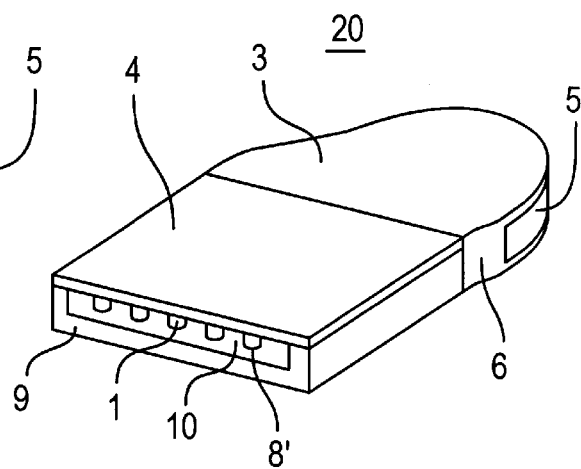

In the present invention, the air intake aperture 5 is preferably provided on a side wall portion 6 of said chamber and arranged in a position in the vicinity of an outer periphery edge of said centrifugal fan 2, as shown in FIGS. 2(A) and 2(B).

Further, in the present invention, a fan motor 13 for driving said centrifugal fan 2 is provided inside of said hermetical chamber 7.

Figure 3:
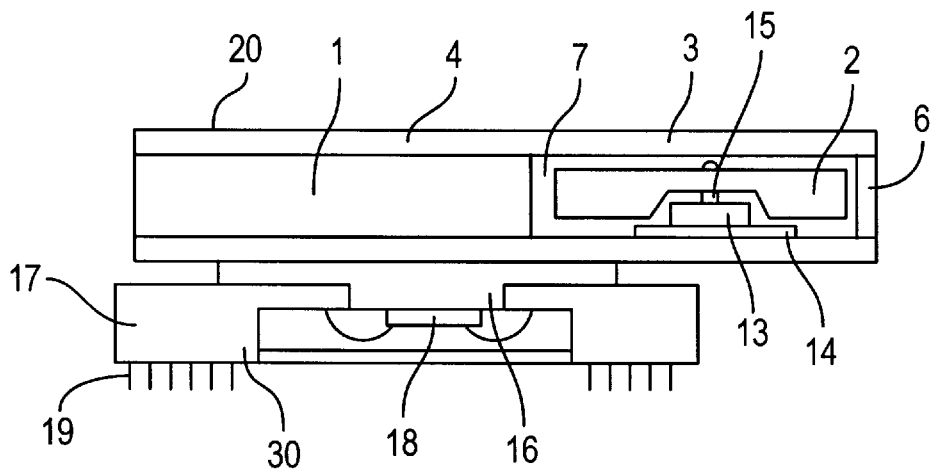
FIG. 3 is a cross-sectional view of a heatsink of the present invention which is mounted on a semiconductor device.
Figure 4:
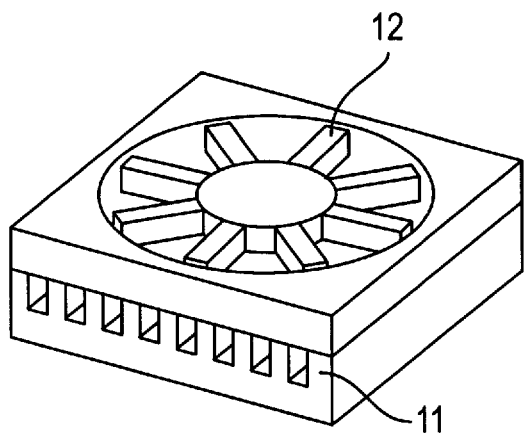
FIG. 4 is a perspective view of one embodiment of a semiconductor device heatsink of the past.

As shown in FIG. 3, in one example of the present invention, the centrifugal fan 2 is provided inside the hermetical chamber 7 and rotatably supported by a rotary axis 15 rotated by the fan motor 13 which is controlled by a controlling circuit board 14 being also provided inside the chamber 7.

And FIG. 3 also shows how the heatsink 20 of the present invention is actually used with a semiconductor device 30 comprising a package 17 with a plurality of connecting pins 19 and containing a chip 18 inside the package 17.

In that, the fin portion 1 of the heatsink 20 of the present invention is directly attached to a back surface of a substrate plate 16 on a front surface of which a chip 18 is mounted.

More specifically embodiment of the present invention will be explained hereunder.

The preferable dimensions of important part of the heatsink 20 of the present invention will be disclosed hereunder but these dimensions do not bind the scope of the present invention only to these numerical figures.

For example, it would be preferable that the length a of the fin portion 1 of the heatsink 20 of the present invention as shown in FIG. 2(A), is 30 to 60 mm, the width d thereof being 30 to 60 mm, the height e thereof being 10 to 30 mm, the width b of fin 1 being 0.5 to 2 mm and the width c of the air flowing path 10 being 1 to 4 mm.

On the other hand, in the present invention, although the air intake aperture 5 can be provided at any portion on a side wall 6 of the hermetical chamber 7, it is preferably provided on the side wall 6 thereof and at around the position as indicated by reference C shown in FIG. 1(A).

Figure 1B:
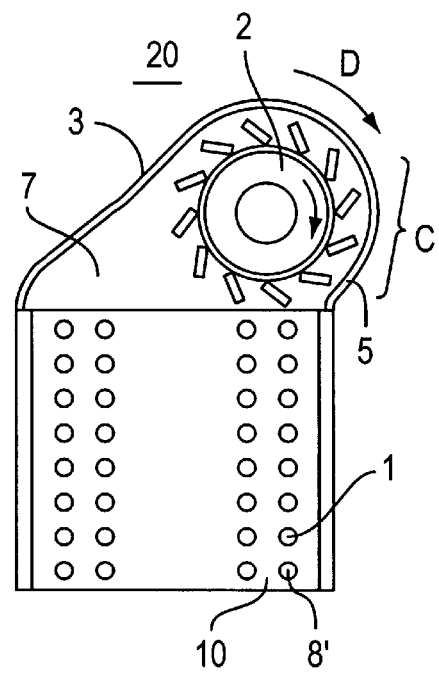

Moreover, in the present invention, a configuration of the hermetical chamber 7 is important so as to improve the radiation effect and thus the configuration thereof as shown in FIGS. 1(A) or 1(B) is one of ideal configuration of the chamber. By using this hermetical chamber 7 having such a configuration, each amount of air volume of air flows flowed through the respective air flowing paths 10 can become equal to each other.

Further, in the present invention, the position of the centrifugal fan 2 is also important to the same object as mentioned above and the position of the fan 2 as shown in FIGS. 1(A) or 1(B) is one of ideal position at which the fan should be disposed so that each amount of air volume of air flows flowed through said respective air flowing paths can be equal to each other.

As described above, according to the present invention, it is possible to provide a semiconductor heatsink having a large heat radiating efficiency, enabling the achievement of a semiconductor device which mounts a chip that has high speed and high density.

What is claimed is:

1. A semiconductor device heatsink comprising:

a flat plate having a first end and a second end;

a plurality of one of pins and fins protecting from said flat plate, said plurality of one of pins and fins having free ends spaced apart from said flat plate;

a cover mounted on said free ends to form an air flow path having an air intake at said first end of said flat plate and an air exhaust at said second end of said flat plate;

a fan housing defining a chamber in communication with said air flow path via said air intake, said housing having an air intake aperture;

a centrifugal fan mounted in said housing;

wherein, during operation, said centrifugal fan draws a cooling air through said air intake aperture, and whirls said cooling air around so that it acquires sufficient momentum to discharge perpendicularly from a rotational axis of said centrifugal fan, thereby forcing said cooling air into said chamber, through said air flow path, and through said air exhaust.

2. A semiconductor device heatsink according to claim 1, wherein said fan housing has a side wall that at least partially defines said chamber, and said air intake aperture is provided in said side wall.

3. A semiconductor device heatsink according to claim 2, wherein said air intake aperture is located in a portion of said side wall which is proximate to an outer periphery edge of said centrifugal fan.

4. A semiconductor device heatsink according to claim 1, wherein a fan motor for driving said centrifugal fan is mounted in said chamber.

5. A semiconductor device heatsink according to claim 2, wherein said air flow path has a longitudinal axis, and said side wall is perpendicular to said longitudinal axis.

6. A semiconductor device heatsink according to claim 5, wherein said rotational axis of said centrifugal fan is perpendicular to said longitudinal axis of said air flow path.

7. A semiconductor device heatsink according to claim 2, wherein a plurality of air flow paths is defined between said flat plate, said plurality of one of fins and pins, and said cover.

8. A semiconductor device heatsink according to claim 7, wherein said chamber is shaped, so that equal amounts of said cooling air flows through each of said plurality of air flow paths.

9. A semiconductor device heatsink according to claim 7, wherein said centrifugal fan is positioned within said chamber so that equal amounts of said cooling air flow through each of said plurality of air flow paths.

* * * * *